United States Patent [19]

Gaskill, Jr.

[11] 4,211,992
[45] Jul. 8, 1980

[54] POSITIONING MEANS FOR LIMITED ROTATION MOTOR

[75] Inventor: David M. Gaskill, Jr., Providence, R.I.

[73] Assignee: Atlan-Tol Industries, Inc., West Warwick, R.I.

[21] Appl. No.: 946,210

[22] Filed: Sep. 25, 1978

[51] Int. Cl.² .............................................. H01F 7/08
[52] U.S. Cl. ................................ 335/222; 324/151 A
[58] Field of Search .............. 335/229, 230, 222, 223; 324/151 R, 151 A; 310/36–39, 29

[56] References Cited

U.S. PATENT DOCUMENTS

| | | | |
|---|---|---|---|
| 2,725,529 | 11/1955 | Bernreuter | 324/151 A |
| 2,808,567 | 10/1957 | Lederer | 324/151 A |
| 2,816,255 | 12/1957 | Greif | 324/151 A |
| 2,875,410 | 2/1959 | Lamb | 335/222 X |
| 3,349,355 | 10/1967 | Triplett | 335/222 |
| 3,587,014 | 6/1971 | Nador | 335/222 |
| 4,134,062 | 1/1979 | Pizzuti et al. | 324/175 |

*Primary Examiner*—Donovan F. Duggan
*Attorney, Agent, or Firm*—Salter & Michaelson

[57] ABSTRACT

A limited rotation motor having means for simultaneously positioning the fixed magnet and moving coil thereof with respect both to each other and a fixed stator. A pair of bridges transversely extend across the front and rear stator faces spanning the central opening defined thereby. A first pair of transversely spaced pins inwardly extend from each of the bridges in such a manner so as to contact opposite surfaces of the magnet in side-to-side contact so as to position the magnet with respect to the stator in first horizontal position. A second pair of pins located transversely between the first pair thereof also longitudinally inwardly extend from the respective rear surfaces of the bridges and contact the open face of a slot disposed in the end faces of the magnet so as to position the magnet in a second, i.e. vertical, direction with respect to the stator.

6 Claims, 5 Drawing Figures

U.S. Patent    Jul. 8, 1980    4,211,992
FIG. 1
PRIOR ART
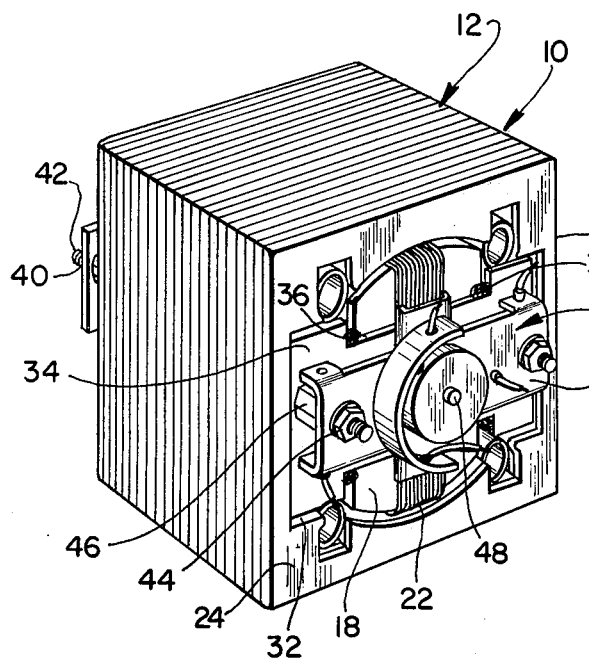
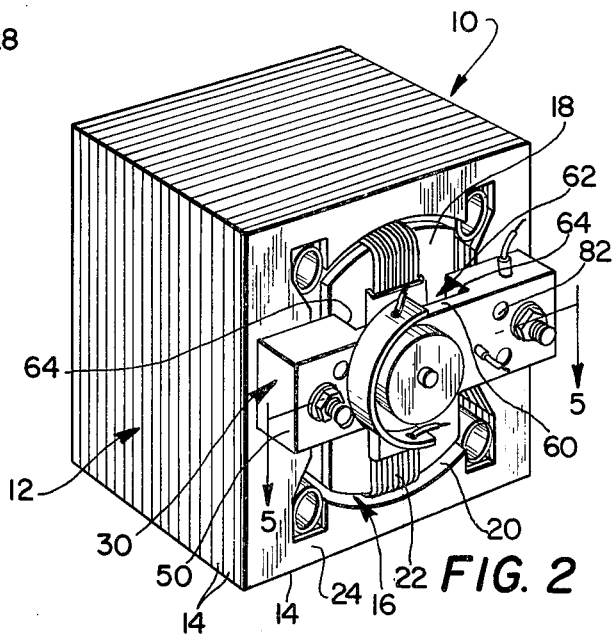
FIG. 2
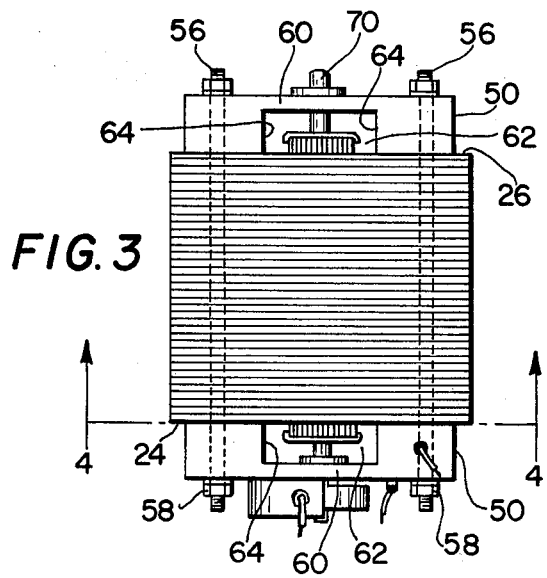
FIG. 3
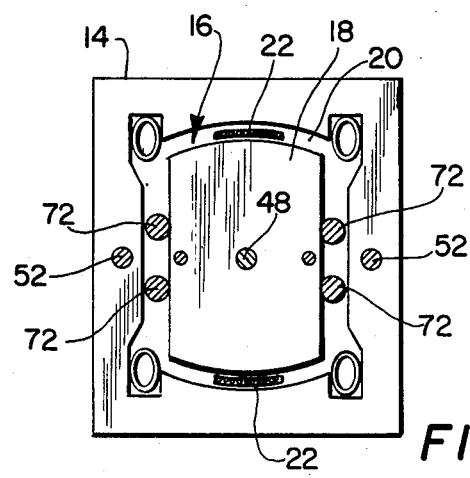
FIG. 4
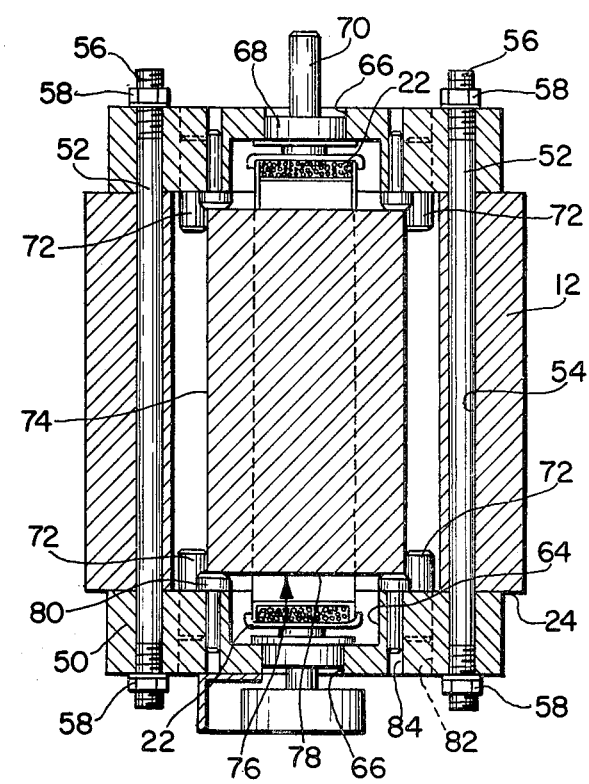
FIG. 5

POSITIONING MEANS FOR LIMITED ROTATION MOTOR

BACKGROUND AND SUMMARY OF THE INVENTION

This invention relates to limited rotation motors of the moving coil or d'Arsonval type. One function of such motors is to move a stylus or pen in conjunction with a recording instrument or the like and thus may be utilized to document the intensity of various input signals.

In the construction of such motors it is necessary that the magnet be precisely positioned with respect to the stator such that a magnetic field space of known dimensions is formed therebetween. Additionally, it is also necessary that the moving coil be positioned so as to freely arcuately move back and forth within such space without contacting either the stator or the magnet. To accomplish such, it has been generally necessary during the assembly of such motors to first independently attach a plate to both end faces of the magnet as by a permanent adhesive connection and then position a pair of brackets in which the coil is rotatably journalled both with respect to the stator and the magnet. This manner of assembly requires considerable trial and error positioning, is time consuming and can lead to inaccuracies.

It would accordingly be desirable to be able to reduce the effort and number of steps required in accurately mounting the magnet and moving coil components of such motors. It is accordingly a principal object of the present invention to provide a positioning device which reduces the time and effort in such aforementioned assembly by simultaneously positioning the magnet and the coil with respect to each other and said stator.

This and other objects of the invention are accomplished by the provision of a pair of bridges laterally spanning the opposite end faces of the stator and in which the coil is previously journalled in a predetermined position with respect thereto. The bridges include a first pair of inwardly extending pins adapted to contact the side surfaces of the magnet in side-to-side longitudinal contact so as to position them laterally with respect to the stator in a first, i.e. horizontal, direction. The bridges further include a pair of second pins also inwardly extending and in contact with an undercut slot provided in the opposite end surfaces of the magnet so as to position the magnet in a second, i.e. vertical, direction with respect to the stator. Inasmuch as the pins form an integral portion of the bridges, mounting of the bridges simultaneously assures the proper positioning of both the magnet and coil with respect to each other and the stator opening.

Other objects, features and advantages of the invention shall become apparent as the description thereof proceeds when considered in connection with the accompanying illustrative drawing.

DESCRIPTION OF THE DRAWING

In the drawing which illustrates the best mode presently contemplated for carrying out the present invention:

FIG. 1 is a perspective view of a limited rotation motor representing the aforementioned prior art construction;

FIG. 2 is a similar perspective view of a limited rotation motor incorporating the features of the present invention;

FIG. 3 is a top plan view of the motor shown in FIG. 2;

FIG. 4 is a front elevational view taken along the line 4—4 of FIG. 3; and

FIG. 5 is a sectional plan view taken along the line 5—5 of FIG. 2.

DESCRIPTION OF THE INVENTION

Referring now to the drawing and particularly both FIGS. 1 and 2 thereof, a limited rotation motor in the form of a galvanometer 10 including a stator 12 assembled from a plurality of magnetically permeable laminations 14 is shown. The stator 12 thus defines a longitudinally orientated central opening 16 in which a magnet 18 is fixed in position so as to define a magnetic field space 20 therebetween in which a moving coil 22 is adapted to arcuately move in spaced predetermined disposition with both the stator 12 and the magnet 18. The galvanometer 10 may form a portion of an instrument such as a recorder for recording input signals on a moving chart or the like. A specific device in which the present invention may be incorporated is that shown in copending application Ser. No. 882,287 filed Feb. 28, 1978 and assigned to the assignee of the present application, which description is herein incorporated into the present application by specific reference thereto.

It may thus be apparent that the stator 12 of both the prior art and present constructions respectively shown in FIGS. 1 and 2 present opposed front and rear generally planar face surfaces 24 and 26 respectively. Positioning means 28 of the prior art and positioning means 30 of the present invention are adapted for mounting on the stator 12 with respect to such stator faces 24, 26 as will hereinafter be more apparent.

Referring now to the prior art construction shown in FIG. 1, such includes a recessed face portion or area 32 in which a plate 34 is positioned. The plate is fixedly connected directly to the magnet 18 by means of adhesive connections 36. A similar plate is likewise connected to the rear surface of the magnet 18 in the same manner. The plates 34 with the magnets attached are then positioned within the opening 16 of the stator 12 by means of a pair of opposed generally U-shaped brackets 38 drawn together by a pair of longitudinally extending rods 40 having opposed threaded ends 42. Suitable nuts 44 and spacers 46 serve to position the brackets 38 with regard to their respective plates 34. The brackets further suitably journal a pair of stub shafts 48 which outwardly longitudinally extend from the outer faces of the coil 22 so as to support the coil for back and forth limited rotation movement within the space 16. In such assembly, it is necessary to independently position both the magnet with plates attached in the stator opening as well as the moving coil within the space 16 such that the moving coil moves within the space smoothly and without interference. When these spacing adjustments are correct, the nuts 44 are tightened while holding the device in such position. This is a time consuming trial and error, tedious assembly process which can be avoided by the use of the positioning means 30 of the present invention.

Referring now to FIGS. 2-5, such novel positioning means 30 includes a pair of opposed bridges 50, the inner surfaces of which are adapted to contact the outer stator faces 24, 26. A pair of rods 52 similar to rods 40 are adapted to longitudinally extend through the stator 12 within openings 54 provided for such purpose. The opposite ends of the rods 54 are threaded as at 56 and are provided with nuts 58 such that upon tightening of the nuts 58, the bridges 50 are drawn inwardly towards each other in firm contact with the outer faces 24, 26. Each of the bridges 50 includes a reduced thickness portion 60 in part defined by a vertically orientated slot 62 having opposed faces 64. The reduced thickness portions 60 of each bridge 50 includes an opening 66, which openings are respectively aligned with each other and adapted to house bearings 68. Stub shafts 70 which outwardly extend from the coil 22 are journalled for limited rotation in the bearings 68.

Inwardly extending from each of the inner faces of the bridges 50 is a plurality of first pins 72 arranged in laterally spaced pairs with the individual pins 72 in each pair thereof disposed vertically in line with each other. A side surface of each such pin 72 is adapted to engage an outer side surface 74 of the magnet 18 in a side-to-side contact, and in this way the positioning of the bridges 50 with respect to the stator 12 serves to simultaneously position the magnet 18 with respect to the stator 12 in first direction, i.e. in the horizontal position as depicted in the drawing. Additionally, and in order to space the magnet 18 in a second direction, i.e. vertically as depicted in the drawing, the opposed faces of the magnet 18 are provided with a transversely extending slot 76 having an open vertically orientated face 78. A pair of second pins 80 of lesser longitudinal extent than the pins 72 and also transversely disposed inwardly of the first pin pairs longitudinally extend inwardly from the inner opposed faces of the bridges 50 for disposition in the slots 76 and in contact with the faces 78 thereof. In this manner then, the longitudinal positioning of the magnet 18 with respect to the stator opening 20 as well as the vertical positioning of the magnet with respect thereto is simultaneously accomplished. Both the pins 72 and 80 may be either integrally formed with the bridges 50 or may be positioned within openings 82 and 84 respectively; such positioning being accomplished either by force fit, screw adjustment, or other equivalent means.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. In a limited rotation motor having a fixed stator including front and rear generally planar faces which define a central opening longitudinally extending therebetween, a fixed permanent magnet mounted within said stator opening and disposed in closely opposed spaced radial opposition thereto and forming a magnetic field therebetween, and a moving coil positioned for back and forth limited arcuate movement within said magnetic field; the improvement comprising, means for simultaneously positioning said magnet and coil with respect to each other and said stator, said positioning means including a pair of opposed bridges transversely extending across said front and rear stator faces respectively, each of said bridges including at least one pair of transversely spaced longitudinally directed first pins extending inwardly from the inner surface of said bridge proximal to its respective stator face into said stator opening and contacting opposite side surfaces of said magnet in side-to-side parallel contact to laterally space said magnet within said stator opening in a first direction, a pair of transversely spaced longitudinally directed second pins positioned transversely between said first set of pins and extending inwardly from said bridge inner surfaces, the terminal ends of said second pins positioned in contact with the open face of an undercut formed on the longitudinally opposed front and rear faces to laterally space said magnet within said stator opening in a second direction coplanar and normal to said first direction, and means for maintaining said bridges in fixed position relative to said stator, said coil rotatably journalled in said bridges at opposite ends thereof.

2. The device of claim 1, each of said undercuts respectively defining an inwardly extending slot in the front and rear faces of said magnet, said second pins extending into the slots of said respective magnet faces.

3. The device of claim 1 or 2, there being two pair of said first pins on each said bridge, said pairs of first pins spaced apart from each other in said second direction.

4. The device of claim 3, said first direction being horizontal and said second direction being vertical.

5. The device of claim 1 or 2, said means for maintaining said bridges in fixed position including a pair of parallel laterally spaced openings longitudinally extending through said stator, said openings in receipt of a pair of rods in turn having threaded terminal ends, said rod ends adapted to pass through said bridges, and nuts adapted to engage said threaded ends for forcing said bridges towards each other when said nuts are tightened.

6. The device of claim 5, each of said inner bridge faces being in direct contact with a respective front or rear face of said stator.

* * * * *